United States Patent [19]

Sekiba

[11] Patent Number: 5,148,100

[45] Date of Patent: Sep. 15, 1992

[54] HANDLER USED IN TESTING SYSTEM FOR SEMICONDUCTOR DEVICES

[75] Inventor: Takashi Sekiba, Murata, Japan

[73] Assignee: Fujitsu Miyagi Electronics Limited, Miyagi, Japan

[21] Appl. No.: 757,405

[22] Filed: Sep. 10, 1991

[30] Foreign Application Priority Data

Sep. 14, 1990 [JP] Japan .................................. 2-244637

[51] Int. Cl.⁵ ........................ G01R 31/26; B65G 47/00
[52] U.S. Cl. ................................ 324/158 F; 324/73.1;
324/158 R; 198/339.1; 198/952; 414/224
[58] Field of Search ............... 324/158 R, 158 F, 73.1;
414/222, 223, 224, 225, 226, 414; 209/573, 576;
198/345, 397, 339.1, 803.15, 952; 73/865.8;
901/40

[56] References Cited

U.S. PATENT DOCUMENTS

| | | | |
|---|---|---|---|
| 3,408,565 | 10/1968 | Frick et al. | 324/158 F |
| 3,412,333 | 11/1968 | Frick et al. | 324/158 F |
| 3,797,632 | 3/1974 | Riggs | 198/339.1 |
| 4,674,181 | 6/1987 | Hamada et al. | 414/226 |
| 4,747,479 | 5/1988 | Herrman | 324/158 F |
| 4,907,701 | 3/1990 | Kobayashi et al. | 414/225 |

Primary Examiner—Vinh Nguyen
Attorney, Agent, or Firm—Armstrong, Nikaido, Marmelstein, Kubovcik & Murray

[57] ABSTRACT

A handler used in a testing system for semiconductors includes an arm shaped conveyer unit for conveying a semiconductor device from a first end thereof to a second end thereof and vice versa, a loader/unloader unit which is provided at the first end of the conveyer unit, a setting unit which is provided at the second end of the conveyer unit, and an adjusting unit for adjusting the setting unit on a testing position which is a predetermined position with respect to a test head. The conveyer unit includes a ring shaped conveyer belt which is rotated between the first end of the conveyer unit and the second end thereof, and a plurality of holders each of which is fixed on an outer surface of the conveyer belt and holds the semiconductor device. The loader/unloader unit includes a first tray for storing a non-tested semiconductor device, a second tray for storing a tested semiconductor device, and a moving mechanism for moving the non-tested semiconductor device from the first tray to the conveyer unit and for moving the tested semiconductor device, which has been conveyed by the conveyer unit to the first end thereof, from the conveyer unit to the second tray. The setting unit includes a mechanism for setting the non-tested semiconductor device on the test head and for returning the tested semiconductor device from the test head to the conveyer unit, the conveyer unit then conveying the tested semiconductor device from the second end thereof to the first end thereof.

18 Claims, 10 Drawing Sheets

HANDLER USED IN TESTING SYSTEM FOR SEMICONDUCTOR DEVICES

BACKGROUND OF THE INVENTION (1) Field of the Invention

The present invention generally relates to a handler for supplying a semiconductor device to a test head and for receiving a tested semiconductor device from the test head, and more particularly to a handler used in a testing system for semiconductor devices which is capable of easily being coupled to the test head.

(2) Description of Related Art

A process for manufacturing semiconductor devices (herein after referred to as an IC) includes a step for bonding a semiconductor chip on a die pad of a lead frame, a step for bonding an Au wire on each electrode of the semiconductor chip and each corresponding lead, a step for encapsulating the lead frame with a package formed of resin or ceramic, and a step for cutting and bending the lead frame.

After the IC is manufactured, electrical characteristics of the IC are measured by a testing system so as to check the quality of the IC. When the quality of the IC is checked, a handler automatically supplies the IC to a test head of the testing system. Then when the testing of the IC is completed, the handler automatically receives the tested IC from the test head. Conventionally, since the handler must be fixed at a predetermined position with respect to the test head, a supporting table for the test head is provided at a predetermined position on the handler, or a supporting table for the test head which has a mechanism for being connected to the handler is provided.

Figure 1A:
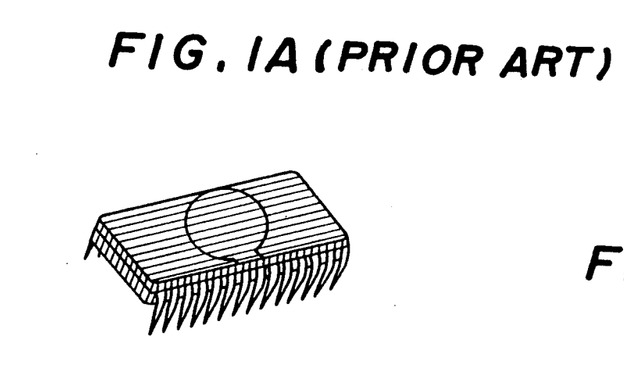
FIGS. 1A and 1B are perspective views showing different types of IC packages.
Figure 1B:
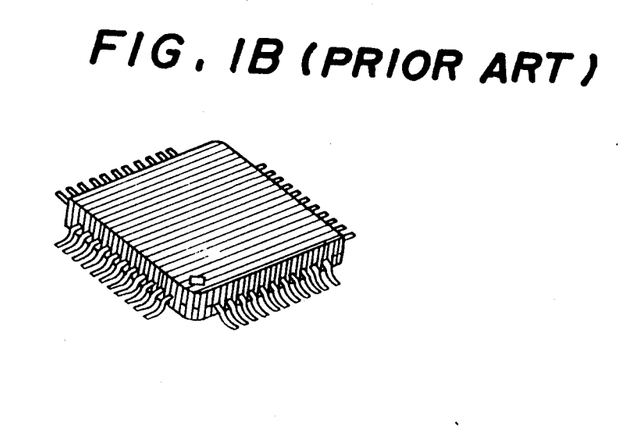
Figure 2A:
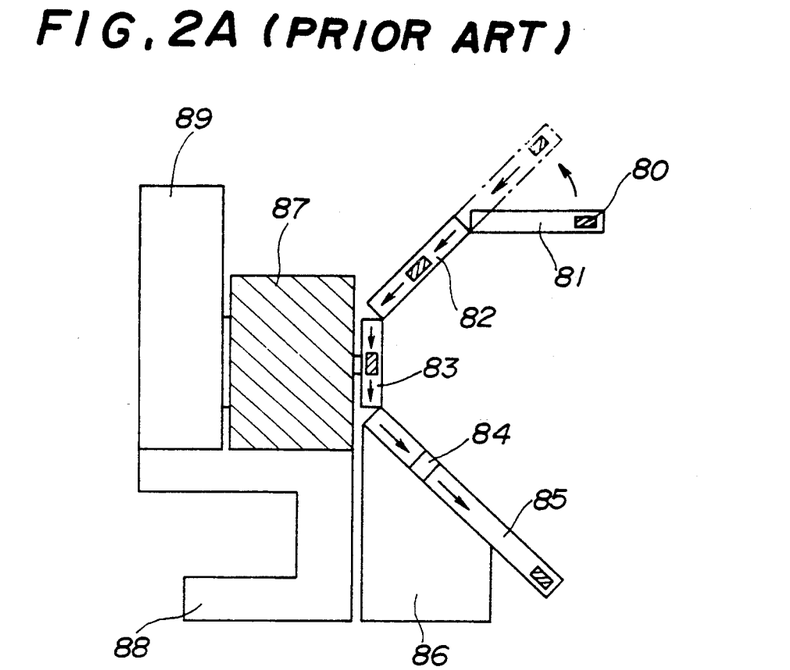
FIGS. 2A and 2B are diagrams showing conventional testing systems for semiconductors, each system including a conventional handler.
Figure 2B:
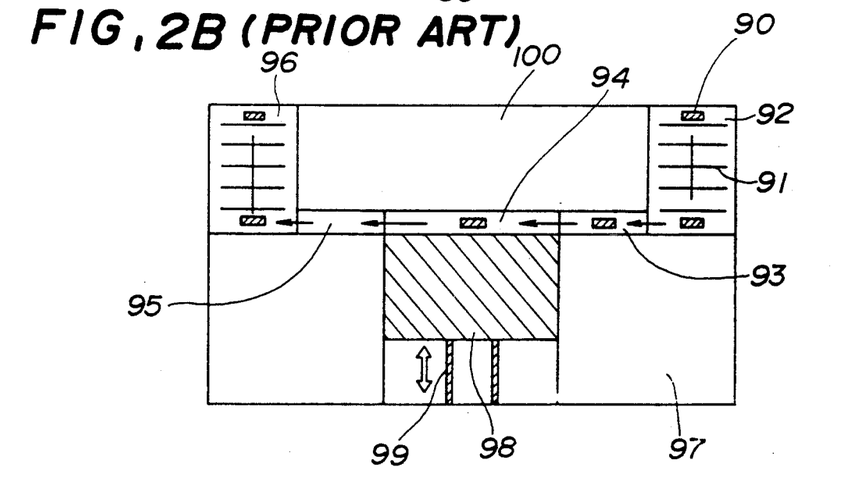

FIGS. 1A and 1B show examples of IC packages. An IC package shown in FIG. 1A is referred to as a DIP (Dual In-Line Package), and an IC package shown in FIG. 1B is referred to as a QFP (Quad Flat Package). FIGS. 2A and 2B show conventional handlers used in the testing system.

Referring to FIG. 2A, a testing system, which tests, for example, the DIP-IC, has a handler and a test head 87. The handler includes a loader unit 81, a heating-/cooling unit 82, a testing part 83, an assorting unit 84, an unloader unit 85, and a handler main body 86. The test head 87 and a tester connector 89 which connects the test head 87 to a tester (not shown) are fixed on a supporting table 88. The test head 87 is connected to the testing part 83 of the handler. The supporting table 88 is joined to the handler main body 86. The loader 81 and the heating/cooling unit 82 are positioned above the test head 87. The assorting unit 84 and the unloader 85 are respectively positioned under the test head 87. The DIP-IC 80 which is picked out of a container (not shown) falls from the loader 81 via the heating/cooling unit 82 to the testing part 83 due to gravity. Then the electrical characteristics of the DIP-IC 80 are measured by the tester under a condition in which the DIP-IC 80 is set on a socket of the testing part 83. After this, the tested DIP-IC 80 is classified by the assorting unit 84 in accordance with measurement results of the tester and unloaded in the unloader unit 85.

A testing system shown in FIG. 2B is used for testing, for example, a QFP-IC as shown in FIG. 1B. This testing system has a loader unit 92, a heating/cooling unit 93, a testing part 94, an assorting unit 95, an unloader unit 96, a handler main body 97, a test head 98, and a tester connector 100. The test head 98 is mounted on an elevation mechanism 99 housed in the handler main body 97 so that a position of the test head 98 can be adjusted in vertical and horizontal directions, and in clockwise and counterclockwise directions. The loader unit 92 is mounted on a first end of the handler main body 97 and the unloader unit 96 is mounted on a second end of the handler main body 97 so that a QFP-IC 90 is fed from the loader unit 92 to the unloader unit 96 in the horizontal direction. The QFP-IC 90 which is picked out of a tray 91 is fed from the loader unit 92 via the heating/cooling unit 93 to the testing part 94. When the QFP-IC 90 is supplied to the testing part 94, the electrical characteristics of the QFP-IC 90 are measured by a tester (not shown) under a condition in which the QFP-IC 90 is set on the testing part 94, which is connected to the test head 98. After this, the tested QFP-IC 90 is classified by the assorting unit 95 in accordance with the measurement result of the tester and unloaded in the unloader unit 96.

In the conventional handlers shown in FIGS. 2A and 2B, the loader unit and the unloader unit are placed at different positions, so that a first path between the loader unit and the testing part and a second path between the testing part and the unloader unit are separated from each other. Thus, the conventional handler becomes large in size.

In a case where the device under test (DUT) is changed, the test head must also be changed.

In the conventional handler shown in FIG. 2A, as the handler must be used under a condition in which the test head on the supporting table joined to the handler main body is connected to the testing part of the handler, it is troublesome to change the test head to a new one when the DUT is changed. That is, when the test head is changed to a new one, the test head must be removed from the supporting table, then a new test head must be mounted on the supporting table and connected to the testing part of the handler, and the new test head connected to the testing part of the handler must be adjusted to test the new DUT. Recently, as the tester of the semiconductor device has become large in size and weight, it is has become even more troublesome to change the tester head to new one. For example, a time within a range of 5-6 hours is required for changing the test head.

On the other hand, in the conventional handler shown in FIG. 2B, the test head is mounted in the handler. Thus, the handler becomes even larger in size. In addition, the handler itself must be changed to new one when the test head is changed.

SUMMARY OF THE INVENTION

Accordingly, a general object of the present invention is to provide a novel and useful handler used in a testing system for semiconductor devices in which the disadvantages of the aforementioned prior art are eliminated.

A more specific object of the present invention is to provide a handler used in a testing system for semiconductor devices capable of being miniaturized.

Another object of the present invention is to provide a handler in a testing system for semiconductor devices in which a test head coupled thereto can be easily changed to a new one.

The above objects of the present invention are achieved by a handler for supplying a semiconductor device to a test head which is separated from the handler and used to measure an electrical characteristic of the semiconductor device and for receiving a semiconductor device whose electrical characteristic has been measured by the test head, the handler comprising: an arm shaped conveyer unit for conveying a semiconductor device from a first end thereof to a second end thereof and vice versa; a loader/unloader unit which is provided at the first end of the conveyer unit; a setting unit which is provided at the second end of the conveyer unit; and an adjusting unit for adjusting the setting unit at a testing position which is a predetermined position with respect to the test head, wherein the conveyer unit comprises a ring shaped conveyer belt which is rotated between the first end of the conveyer unit and the second end thereof, and a plurality of holders each of which is fixed on an outer surface of the conveyer belt and holds the semiconductor device, so that each of the holders is circulated between the first end of the conveyer unit and the second end thereof by a rotation of the conveyer belt, wherein the loader/unloader unit comprises first storage means for storing a non-tested semiconductor device which is a semiconductor device whose electrical characteristic has not been measured by the test head yet, second storage means for storing a tested semiconductor device which is a semiconductor device whose electrical characteristic has been measured by the test head, and moving means for moving the non-tested semiconductor device from the first storage means to the conveyer unit and for moving the tested semiconductor device, which has been conveyed by the conveyer unit to the first end thereof, from the conveyer unit to the second storage means, and wherein the setting unit comprises means for setting the non-tested semiconductor device which is conveyed by the conveyer unit to the second end thereof on the test head and for returning the tested semiconductor device from the test head to the conveyer unit, the conveyer unit then conveying the tested semiconductor device from the second end thereof to the first end thereof.

According to the present invention, as the arm shaped conveyer unit conveys the semiconductor device from the loader/unloader unit to the setting unit and vice versa, the handler can be made smaller than the conventional handler. In addition, as the handler is separated from the test head and the adjusting unit adjusts the setting unit at the testing position, the test head can be easily changed to a new one.

Additional objects, features and advantages of the present invention will become apparent from the following detailed description when read in conjunction with the accompanying drawings.

DESCRIPTION OF PREFERRED EMBODIMENTS

A description will now be given of the principle of the present invention with reference to FIG. 3, which is a diagram illustrating the principle of the present invention.

Figure 3:
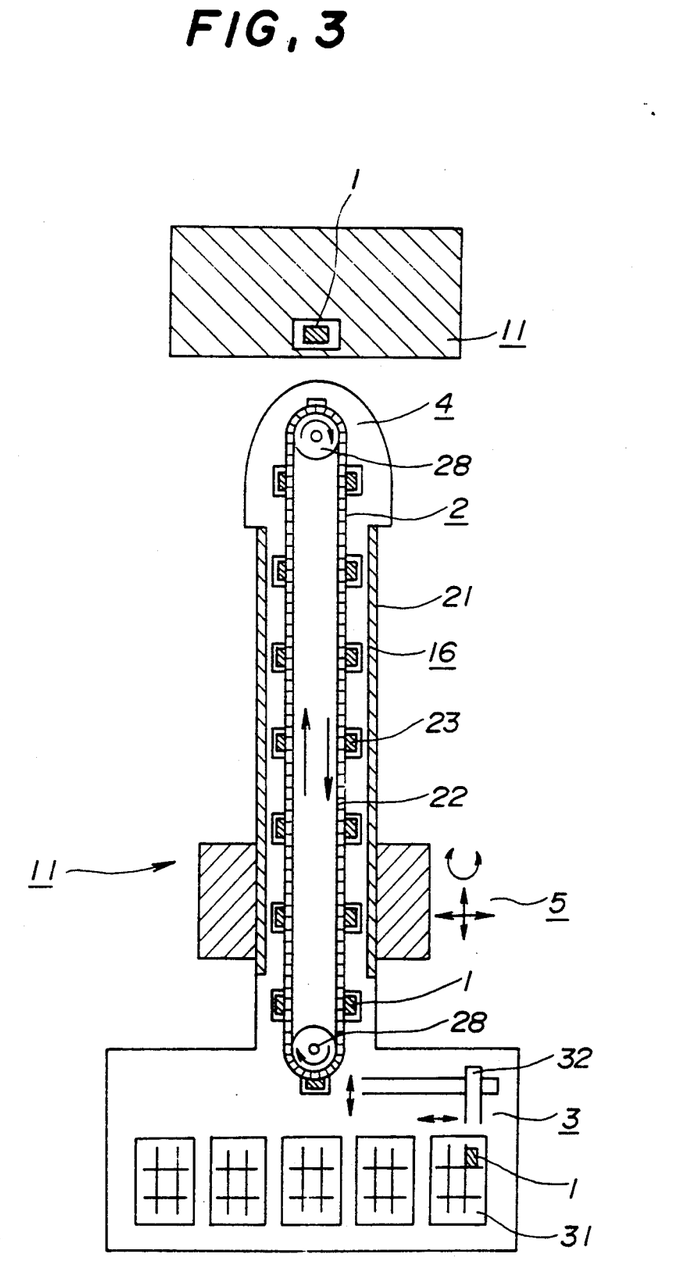
FIG. 3 is a diagram illustrating the principle of the present invention.

Referring to FIG. 3, a handler 10 is separated from a test head 11 in a testing system and comprises a conveyer unit 2, a loader/unloader unit 3, a testing part 4, and an adjusting unit 5. The conveyer unit 2 is supported by the adjusting unit 5. The conveyer unit 2 is provided between the loader/unloader 3 and the testing part 4.

The test head 11 can be independently moved with respect to the handler 10. A device under test (DUT) 1 (hereinafter referred to as a device 1) which is loaded on the test head 11 is electrically connected to a tester so that electrical characteristic of the device 1 is measured by the tester.

The conveyer unit 2 has an arm 21, a conveyer belt 22, and a plurality of holders 23. The conveyer belt 22 is wound between shafts of motors 28 provided at both the first and second ends of the arm 21 so as to be rotated around the two shafts of the motors 28. The holders 23 are fixed on an outer surface of the conveyer belt 22 at predetermined intervals. When the conveyer belt 22 is rotated by the motors 28, each of the holders 23 circulates with the rotated conveyer belt 22 in the arm 21. The device 1 held on each of the holders 23 is conveyed from the loader/unload unit 3 to the testing part 4 and returned from the testing part 4 to the loader/unloader unit 3.

The loader/unloader unit 3 has a storage portion in which a plurality of trays 31 are arranged and a pickup 32. The trays 31 includes supply trays and receiving trays. The devices 1 are stored in each of the supply trays. The pickup 32 picks the device 1 up from the supply tray and loads it on one of the holders 23, and then picks the device 1 up from each of the holders 23 and returns it to the receiving tray.

In the testing part 4, the device 1 is picked up from each of the holders 23 and set on the test head 11. After the electrical characteristic of the device 1 is measured, the device 1 on the test head 11 is returned to a corresponding one of the holders 23.

The adjusting unit 5 supports a handler main body formed of the conveyer unit 2, the testing part 4 and the loader/unloader 3 so that the handler main body can be moved in horizontal and vertical directions and rotated in clockwise and counterclockwise directions. The testing part 4 provided at an end of the arm 21 is controlled so as to be placed at a predetermined position with respect to the test head 11.

In a thermal test in which the electrical characteristics of the device 1 are measured under a condition in which the device is heated or cooled, a heating/cooling unit 16 is activated.

In the above handler, a first path through which the device 1 is fed from the loader/unloader 3 to the testing part 4 and a second path through which the device is fed from the testing part 4 back to the loader/unloader 3 are formed in the conveyer unit 2. That is, the first path and the second path are integrated with each other in the arm 21. Thereby, the handler having the above structure shown in FIG. 3 is smaller in size than the conventional handler. In addition, as the handler is separated from the test head, the handler itself can be miniaturized and the test head can be easily changed to a new one when the device 1 which is being tested is changed to a new type of device.

Each of the holders 23 can have a structure in which various type of IC can be held thereon. Due to some parts of the loader/unloader 3 and the pickup unit 32 being exchanged for other parts, various types of ICs can be measured.

A description will now be given of an embodiment of the present invention with reference to FIGS. 4 through 10.

Figure 4:
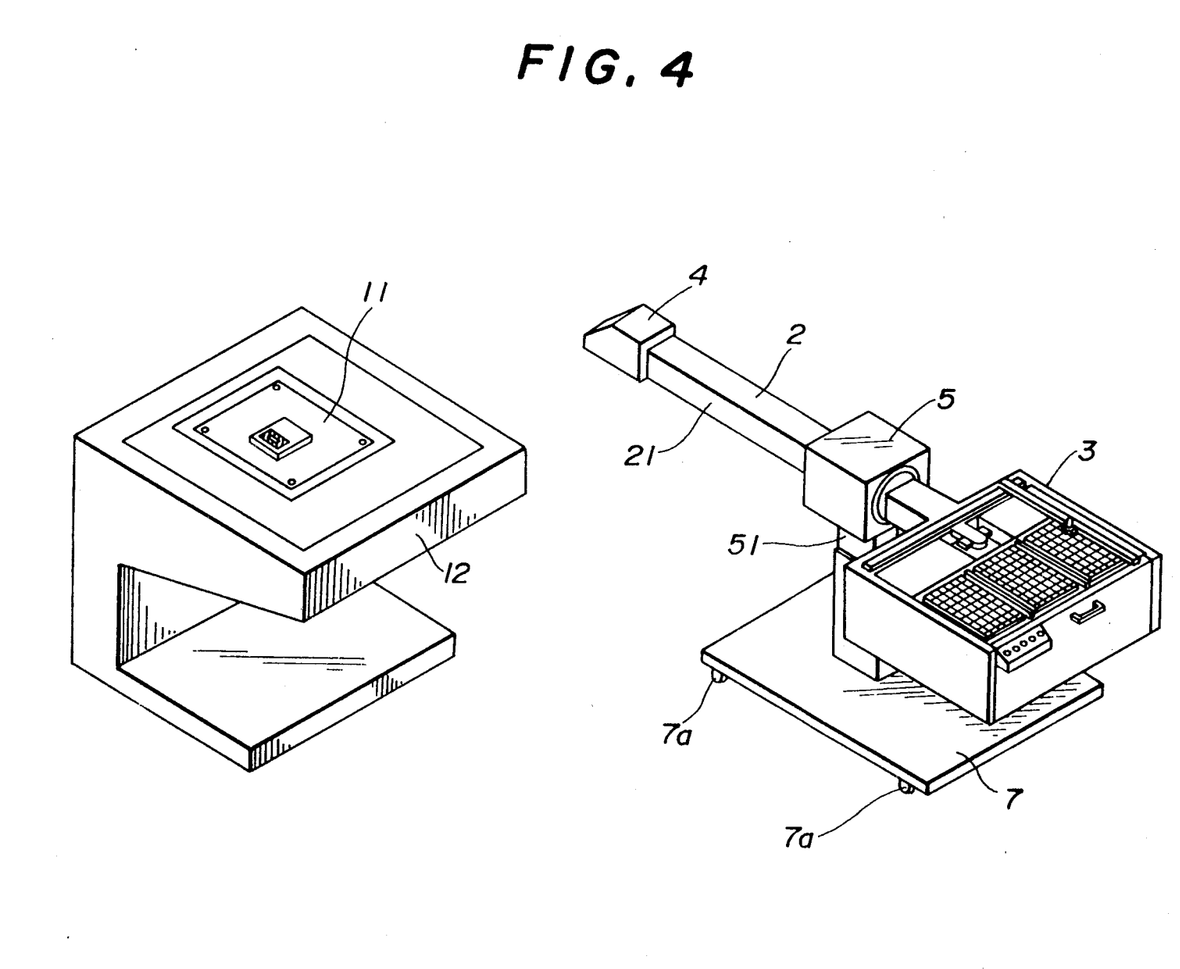
FIGS. 4 and 5 are perspective views showing a testing system including a test head and a handler according to an embodiment of the present invention.
Figure 5:
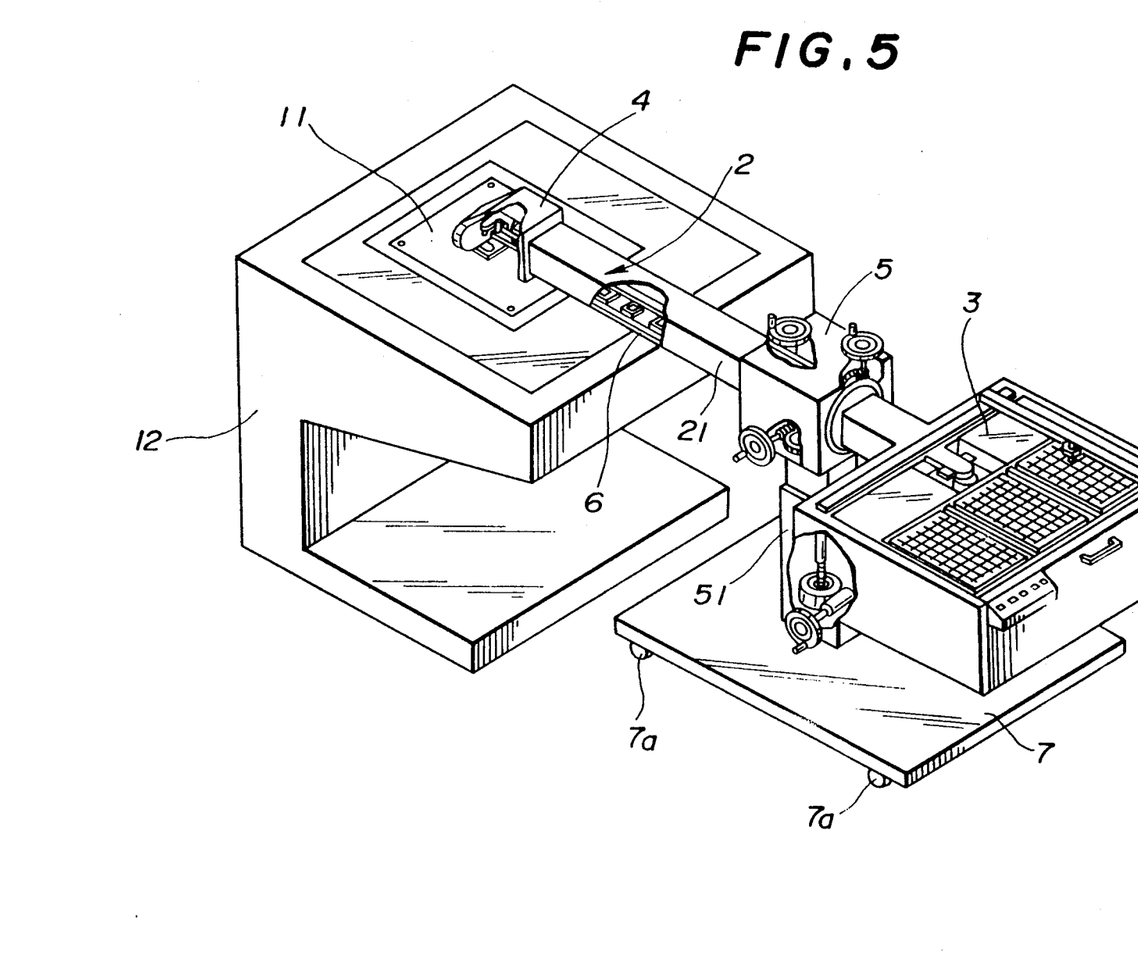

FIG. 4 is an exterior view of a testing system including a handler according to the present invention. FIG. 5 is a partially cut away perspective view showing the testing system in which the handler and the test head are coupled to each other.

Referring to FIGS. 4 and 5, a test head 11 is mounted on a supporting table 12. The test head 11 is separated from the a handler. The handler has a handler main body which is formed of a conveyer unit 2, a loader/unloader unit 3, and a testing part 4. The conveyer unit 2 has a square pipe shaped arm 21. The arm 21 passes through an adjusting unit 5 so as to be supported thereby. A testing part 4 is formed at a first end of the arm 21 and a loader/unloader unit 3 is connected to a second end of the arm 21. The adjusting unit 5 is supported by an elevation unit 51 which is mounted on a base plate 7. The base plate 7 has casters 7a mounted on a rear surface thereof, so that this handler mounted on the base plate 7 can be moved.

Figure 7A:
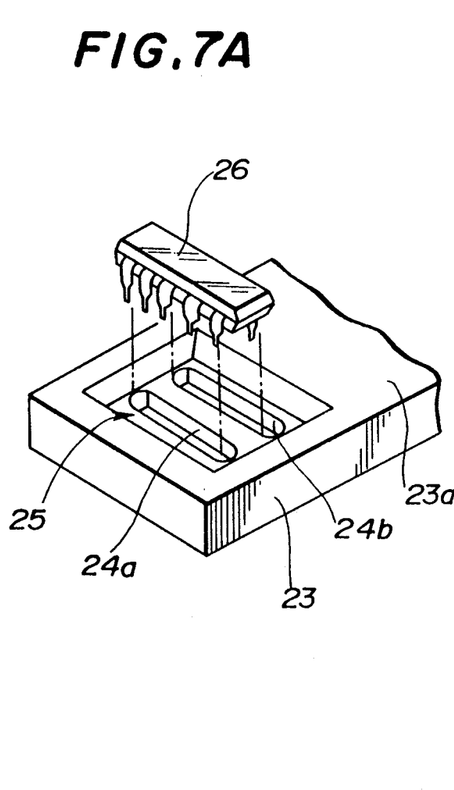
FIGS. 7A and 7B are perspective views illustrating a structure of each holder, each holder holding a different type of IC packages.
Figure 7B:
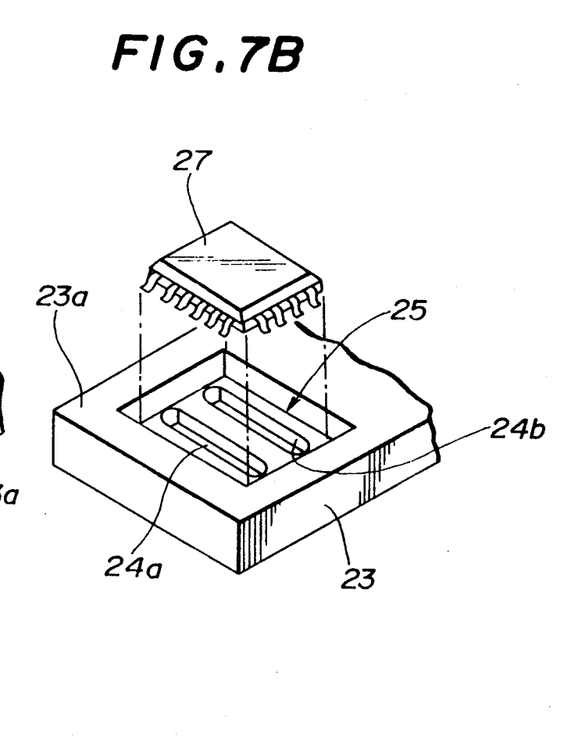

The conveyer unit 2 has basically the same structure as that shown in FIG. 3. That is, a conveyer belt 22 and a plurality of holders 23, which are fixed on the outer surface of the conveyer belt 22 at predetermined intervals, are provided in the square pipe shaped arm 21. The conveyer belt 22 is formed, for example, of an endless chain, and wound between shafts of motors 28 which are mounted at both ends of the arm 21. Thus, when the conveyer belt 22 is rotated by the motors 28, each of the holders 23 is circulated in the square pipe shaped arm 21. Each of the holders 23 has a structure, for example, as shown in FIGS. 7A and 7B, so that both the DIP-IC shown in FIG. 1A and the QFP-IC shown in FIG. 1B are capable of being held thereby. In FIGS. 7A and 7B, each of the holders 23 has a support plate 23a on which a concave holding portion 25 is formed. The shape of the concave holding portion 25 corresponds to the shape of the QFP-IC, so that the QFP-IC can be held in the concave holding portion 25. Two grooves 24a and 24b are formed on a bottom surface of the concave holding portion 25. A distance between the grooves 24a and 24b corresponds to a distance between leads projecting from both sides of the DIP-IC. Thus, the DIP-IC can be held in the concave holding portion 25 in a state where the leads of the DIP-IC are inserted in the grooves 24a and 24b.

Figure 8:
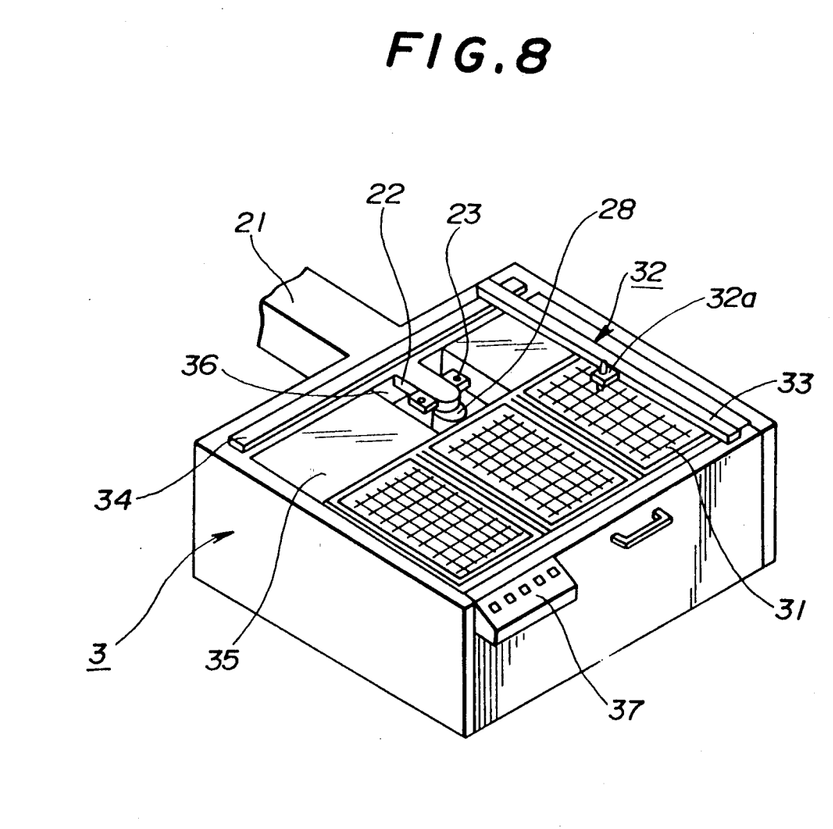
FIG. 8 is a perspective view for illustrating a loader/unloader unit.

The loader/unloader unit 3 which is connected to the arm 21 at the second end thereof has a tray storage part 35 and a pickup unit 32, as is shown in FIG. 8. A concave portion 36 is formed on the tray storage part 35 so as to face the arm 21. A turning part of the conveyer belt 22 at which the conveyer belt 22 is wound around the shafts of the motors 28 is exposed from the concave portion 36. A plurality of trays 31 are placed on the tray storage part 35. Each of the trays 31 is divided into a plurality of blocks. The device 1 is placed on each block of each of the trays 31. Each of the trays 31 is used as either a supply tray for storing the devices which have not been tested yet and a receiving tray for storing the devices which have been completely tested. The pickup unit 32 has an X-Y coordinate type supporting robot formed of a Y-bar 34 extending in a direction (a Y-direction) perpendicular to the arm 21 and an X-bar 33 extending in a direction (an X-direction) perpendicular to the Y-bar 34. The X-bar 33 is supported on the Y-bar 34 so as to be capable of being slid thereon. A pickup head 32a is supported on the X-bar 33 so as to be capable of being slid thereon. The pickup head 32a can be positioned at any positions on the tray storage part 35 of the loader/unloader 3 due to the moving of the X-bar 33 in the Y-direction and the moving of the pickup head 32a in the X-direction. The pickup head 32a picks the device 1 up from the supply tray by a vacuum force and loads it on the holder 23 provided on the conveyer belt 22. In addition, the pickup head 32a picks the device 1 which has been completely tested up from the holder 23 on the conveyer belt 22 and returns it to either the receiving tray for non-defective devices or the receiving tray for defective devices in accordance with test results.

An operation buttons 37 which are used to operate the loader/unloader 3 are provided thereon.

Figure 9:
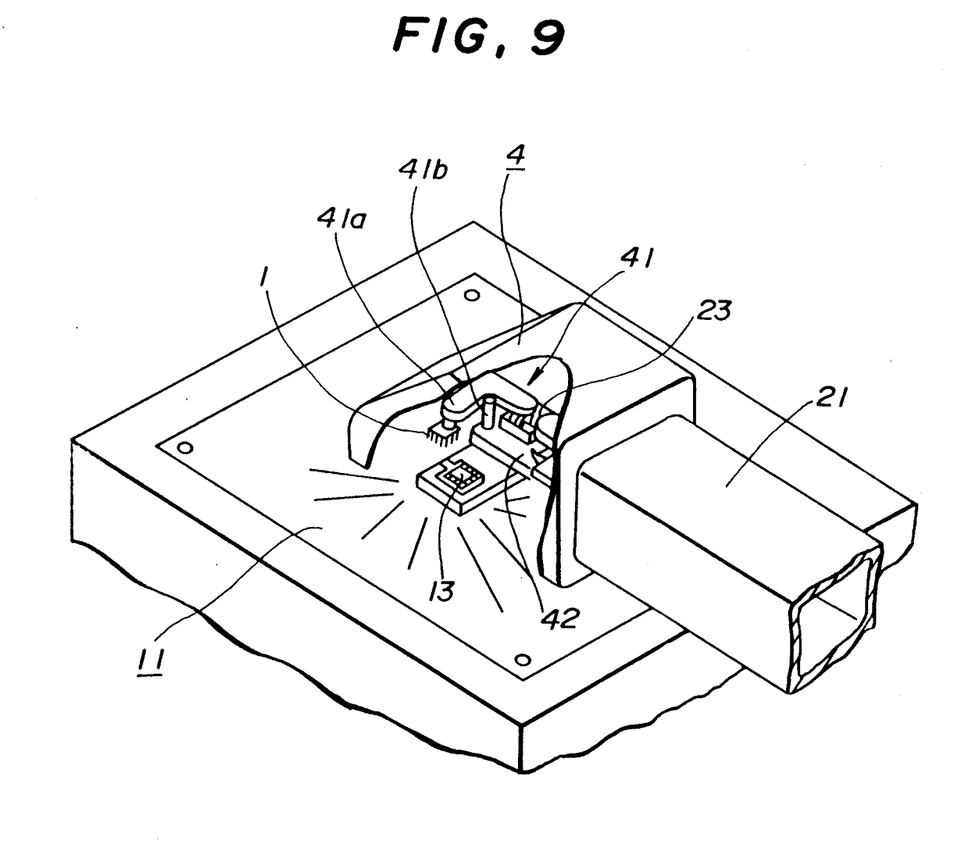
FIG. 9 is a partially cut away perspective view illustrating a coupling between a testing part of the handler and the test head.

FIG. 9 shows a coupling state between the testing part 4 and the test head 11. Referring to FIG. 9, a socket 13 is mounted on the test head 11. The testing part 4 has a contact-pickup unit 41 for moving the device from the holder to the socket 13 of the test head 11 and then returning the device which has been tested from the socket 13 to the holder 23 under a condition in which the testing part 4 is positioned at a predetermined testing position. The contact-pickup unit 41 has a pick-up head mounted on a base 42 which is provided at an end of a support plate (not shown) on which the conveyer belt 22 is provided. The pickup head is formed of a shaft 41b mounted on the base 42 and an L-shaped plate 41a which is pivotably supported on the shaft 41b. The L-shaped plate 41a pivots on the shaft 41b at a predetermined angle alternately in a clockwise direction and a counterclockwise direction. The device 1 is picked up by an end of the L-shaped plate 41a from the holder 23 and then the L-shaped plate 41a pivots on the shaft 41b to move it to the socket 13 of the test head 11. After the device 1 has been tested, the device 1 is returned by reversed pivoting of the L-shaped 41b from the socket 13 to the holder 23. While tested the device 1 which is set on the socket 13 is being, the conveyer belt 21 is stopped. Then the conveyer belt 22 is moved by intervals between two holders 23 which are adjacent to each other after the device 1 is picked up from the holder 23 or the socket 13.

Figure 10:
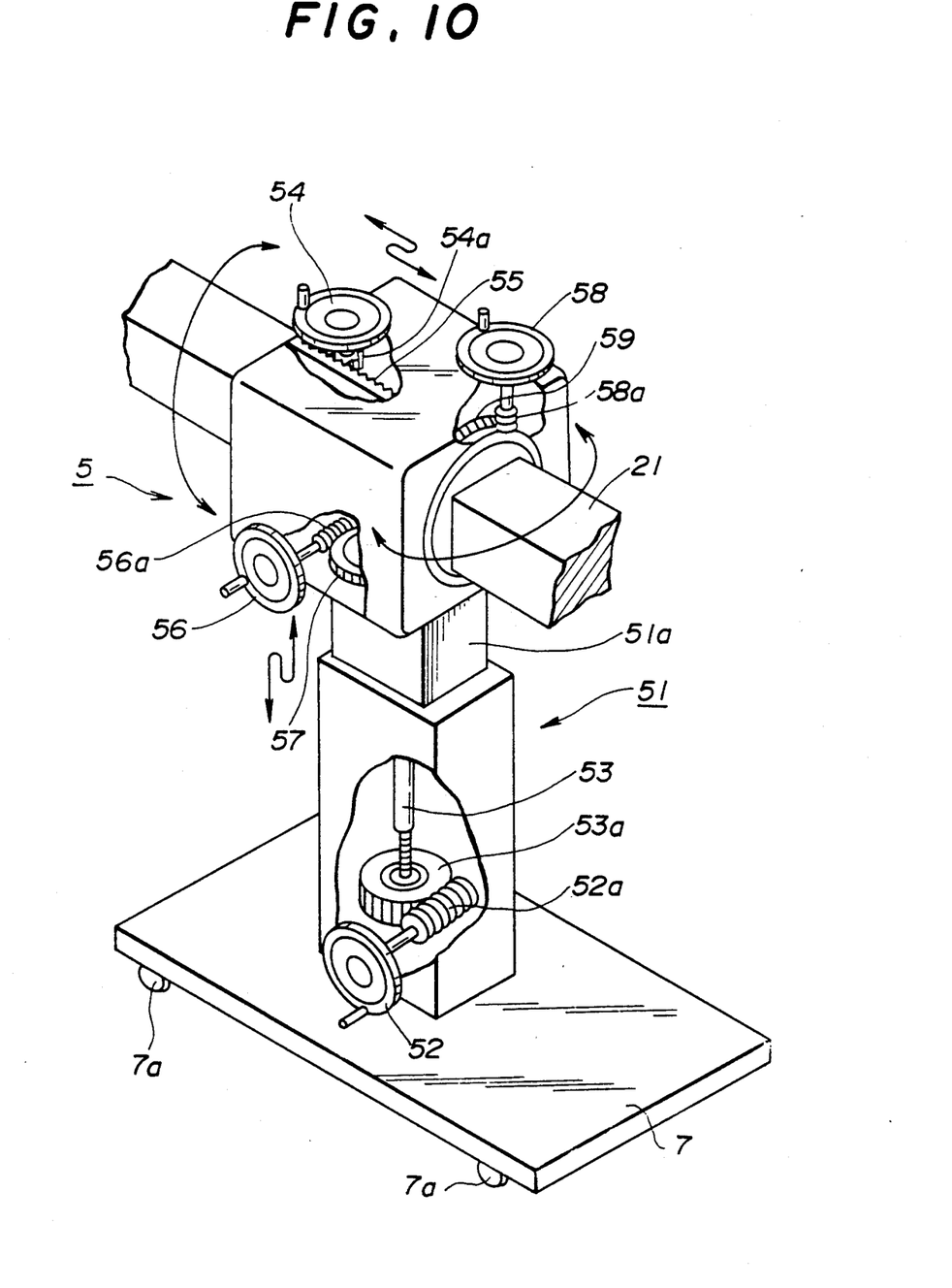
FIG. 10 is a partially cut away perspective view illustrating an adjusting unit.

The adjusting unit 5 can move the arm 21 of the conveyer unit 2 in a direction parallel to the arm 21, and make the arm 21 pivot on an axis parallel to the arm 21 and on an axis perpendicular thereto. Mechanisms for moving the arm 21 are formed in the adjusting unit 5, as shown in FIG. 10. A rack 55 is fixed on the arm 21 so as to be arranged parallel to the arm 21. A first adjusting wheel 54 is rotatably provided on the adjusting unit 5. A pinion gear 54a which is engaged with the rack 55 is fixed on a shaft of the first adjusting wheel 54. Thereby, when the first adjusting wheel 54 is rotated, the arm 21 moves in the direction parallel thereto. A gear 57 is mounted on a shaft which is fixed on the arm 21 so as to be perpendicular thereto. A second adjusting wheel 56 is rotatably provided on the adjusting unit 5. A worm 56a which is engaged with the gear 57 is fixed on a shaft of the second adjusting wheel 56. Thereby, when the second adjusting wheel 56 is rotated, the arm 21 is pivoted on the axis perpendicular to the arm 21. A gear 59 is fixed on the arm 21 coaxingly. A third adjusting wheel 58 is rotatably provided on the adjusting unit 5. A worm 58a which is engaged with the gear 59 is fixed on a shaft of the third adjusting wheel 58. Thereby, when the third adjusting wheel 58 is rotated, the arm 21 is pivoted on the axis parallel to the arm 21.

The adjusting unit 5 is supported on an elevator unit 51. The elevator unit 51 has a slide bar 51a which is capable of sliding up and down. A ball screw jack 53 is connected to the slide bar 51a. A gear 53a is coaxingly fixed at an end of the ball screw jack 53. A fourth adjusting wheel 52 is rotatably provided on the elevator unit 51. A worm 52a which is engaged with the gear 53a is fixed on a shaft of the fourth adjusting wheel 52. Thereby, when the fourth adjusting wheel 52 is rotated, the slide bar 51a is slid up and down by the operation of the ball screw jack 53 so that the conveyer unit 2 integrated with the adjusting unit 4 is brought upward and downward.

In a case where the handler is set at a predetermined position with respect to the test head 11, the base plate 7 on which the handler is mounted is placed adjacent to the supporting table 12 on which the test head 11 is mounted, and then the first, second, third and fourth adjusting wheel are respectively rotated so that the testing part 4 provided at the first end of the arm 21 is set at the testing position as shown in FIG. 9.

Pulse motors substituted for the first, second, third and fourth wheels 54, 56, 58 and 52 can drive the pinion 54a and the worms 56a, 58a and 52a.

Figure 6:
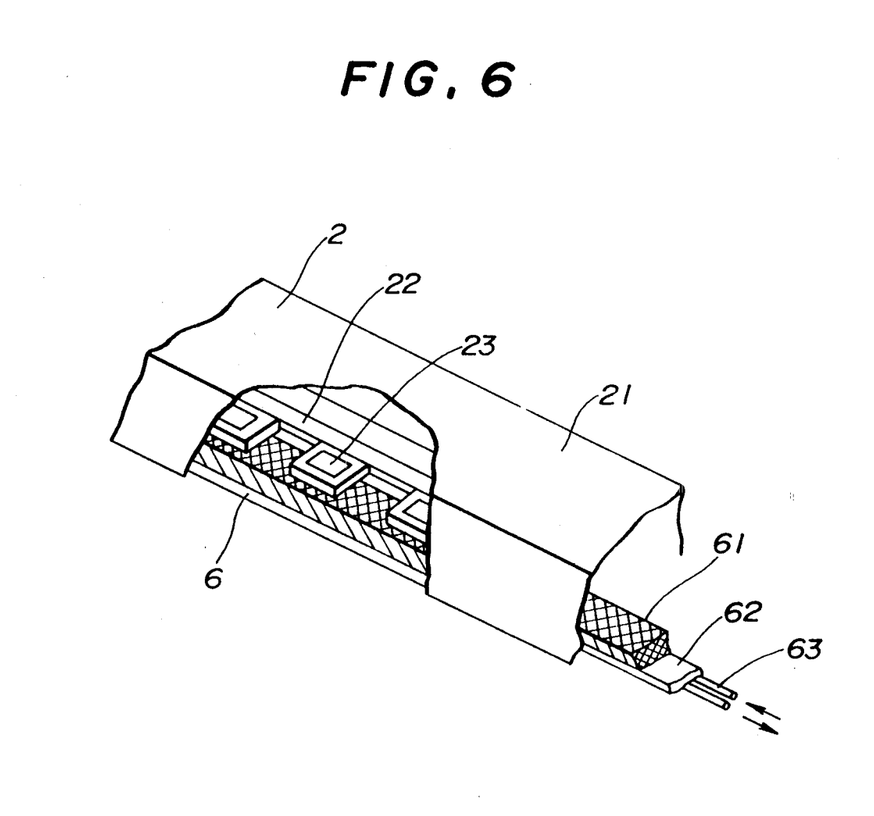
FIG. 6 is a partially cut away view illustrating a heating/cooling unit provided in a conveyer unit.

In addition, the heating/cooling unit 6 is provided under the conveyer belt 22, as shown in FIG. 6, so that the device 1 held on each of the holders 23 is gradually heated or cooled while the conveyer belt 22 is conveying the device 1. Referring to FIG. 6, a plate 61 provided in the arm 21 so as to be in contact with a lower surface of each of the holders 23 which are formed of metal having good conductivity. The cooing/heating unit 6 includes a heating system and a cooling system which are provided under the plate 61. The heating system has a sheet-shaped heater 62 which is adhered to the lower surface of the plate 61. When the sheet-shaped heater 62 is electrically activated, heat generated by the sheet-shaped heater 62 is transmitted via the plate 61 and each of the holders 23 to the device 1. The cooling system has a pipe 63 through which cooling gas, such as liquid nitrogen or liquid carbonic acid gas, passes. When the cooling gas is supplied to the pipe 63, the the device 1 is cooled by the cooling gas in the pipe 63 via the plate 61 and each of the holders 23.

Either only the heating system or the cooling system can be provided in the arm 21. The cooling system can be formed so that the cooling gas is directly supplied to the arm 21.

The present invention is not limited to the aforementioned embodiments, and variations and modifications may be made without departing from the scope of the claimed invention.

What is claimed is:

1. A handler for supplying a semiconductor device to a test head which is separated from said handler and used to measure an electrical characteristic of the semiconductor device and for receiving a semiconductor device whose electrical characteristic has been measured by said test head, said handler comprising:

an arm shaped conveyer unit for conveying a semiconductor device from a first end thereof to a second end thereof and vice versa;

a loader/unloader unit which is provided at the first end of said conveyer unit;

a setting unit which is provided at the second end of said conveyer unit; and an adjusting unit for adjusting said setting unit on a testing position which is a predetermined position with respect to said test head, wherein said conveyer unit comprises a ring shaped conveyer belt which is rotated between the first end of said conveyer unit and the second end thereof, and a plurality of holders each of which is fixed on an outer surface of said conveyer belt and holds the semiconductor device, so that each of said holders is circulated between the first end of said conveyer unit and the second end thereof by a rotation of said conveyer belt, wherein said loader/unloader unit comprises first storage means for storing a non-tested semiconductor device which is a semiconductor device whose electrical characteristic has not been measured by said test head yet, second storage means for storing a tested semiconductor device which is a semiconductor device whose electrical characteristic has been measured by said test head, and moving means for moving the non-tested semiconductor device from said first storage means to said conveyer unit and for moving the tested semiconductor device, which has been conveyed by said conveyer unit to the first end thereof, from said conveyer unit to said second storage means, and wherein said setting unit comprises means for setting the non-tested semiconductor device which is conveyed by said conveyer unit to the second end thereof on said test head and for returning the tested semiconductor device from said test head to said conveyer unit, said conveyer unit then conveying the tested semiconductor device from the second end thereof to the first end thereof.

2. A handler as claimed in claim 1, wherein each of said holders has a plate on which a plurality of of semiconductor device package types can be placed.

3. A handler as claimed in claim 2, wherein said plate has a concave portion whose shape corresponds to a shape of a quad flat packaged (QFP) semiconductor device, two grooves being formed on a bottom surface of said concave portion, and a distance between the two grooves corresponding to a distance between leads of a dual-in line packaged (DIP) semiconductor device, so that both the quad flat packaged semiconductor device and the dual-in line packaged semiconductor device can be held in said concave portion.

4. A handler as claimed in claim 1, wherein said moving means of said loader/unloader unit has a first bar extending in a first direction, a second bar extending in a second direction perpendicular to the first direction, said second bar being slidably provided on said first bar, and a pickup head slidably provided on said second bar, so that said pickup head can be positioned at any position on said loader/unloader unit, and wherein said pickup head picks a semiconductor device up from said loader/unloader unit and supplies it to said conveyer unit and vice versa.

5. A handler as claimed in claim 1, wherein each of said first and second storage means of said loader/unloader means has a tray which is divided into a plurality of blocks, a semiconductor device being stored in each of the blocks.

6. A handler as claimed in claim 1, wherein said conveyer unit has a pipe shaped arm through which the semiconductor device is conveyed.

7. A handler as claimed in claim 1, wherein said adjusting unit has a mechanism which moves said conveyer unit so that said setting unit is positioned at the testing position 8. A handler as claimed in claim 7, wherein said mechanism has a first mechanism for moving said conveyer unit in a direction in which said conveyer unit extends.

9. A handler as claimed in claim 8, wherein said first mechanism has a rack extending in the direction in which said conveyer unit extends, a pinion gear engaged with the rack, and a first driving mechanism for rotating the pinion gear.

10. A handler as claimed in claim 7, wherein said mechanism has a second mechanism for pivoting said conveyer unit on an axis perpendicular to a horizontal surface.

11. A handler as claimed in claim 10, wherein said second mechanism has a gear supported on the axis perpendicular to the horizontal surface, a worm engaged with said gear, and a second driving mechanism for rotating the worm.

12. A handler as claimed in claim 7, wherein said mechanism has a third mechanism for rotating said conveyer unit around an axis of said conveyer unit.

13. A handler as claimed in claim 12, wherein said third mechanism has a gear supported on the axis of said conveyer unit, a worm engaged with the gear, and a third driving mechanism for rotating the worm.

14. A handler as claimed in claim 7, wherein said mechanism has fourth mechanism for moving said conveyer unit in a vertical direction.

15. A handler as claimed in claim 14, wherein said fourth mechanism has a slider bar supporting said conveyer unit, a jack for moving the slider bar in the vertical direction, and a fourth driving mechanism for driving the jack.

16. A handler as claimed in claim 1, wherein said conveyer unit comprises thermal control means for controlling a temperature of a semiconductor device which is conveyed by said conveyer unit.

17. A handler as claimed in claim 16, wherein said thermal control means has heater means for heating a semiconductor device.

18. A handler as claimed in claim 16, wherein said thermal control means has cooling means for cooling a semiconductor device.

* * * * *